United States Patent
Joshi et al.

(10) Patent No.: US 7,006,403 B2
(45) Date of Patent: Feb. 28, 2006

(54) SELF TIMED BIT AND READ/WRITE PULSE STRETCHERS

(75) Inventors: Rajiv V. Joshi, Yorktown Heights, NY (US); Arthur D. Tuminaro, LaGrangeville, NY (US)

(73) Assignee: International Business Machines Corp., Armonk, NY (US)

( * ) Notice: Subject to any disclaimer, the term of this patent is extended or adjusted under 35 U.S.C. 154(b) by 85 days.

(21) Appl. No.: 10/736,415

(22) Filed: Dec. 15, 2003

(65) Prior Publication Data

US 2005/0128855 A1    Jun. 16, 2005

(51) Int. Cl.
G11C 7/22     (2006.01)
G11C 8/10     (2006.01)
G11C 8/18     (2006.01)
G11C 11/413   (2006.01)

(52) U.S. Cl. .................. 365/230.06; 365/233; 365/194; 365/154; 365/189.05

(58) Field of Classification Search ................ 365/233, 365/233.5, 230.06, 194, 189.05, 154; 327/291, 327/175, 174, 172; 326/96, 93, 28
See application file for complete search history.

(56) References Cited

U.S. PATENT DOCUMENTS

| | | | | | |
|---|---|---|---|---|---|
| 4,541,076 A | * | 9/1985 | Bowers et al. | ......... | 365/230.05 |
| 5,221,865 A | * | 6/1993 | Phillips et al. | ................ | 326/86 |
| 5,546,355 A | * | 8/1996 | Raatz et al. | ................ | 365/233 |
| 5,666,324 A | * | 9/1997 | Kosugi et al. | ............... | 365/233 |
| 5,777,935 A | * | 7/1998 | Pantelakis et al. | ........... | 365/203 |
| 5,920,510 A | * | 7/1999 | Yukutake et al. | ....... | 365/189.05 |
| 6,130,846 A | * | 10/2000 | Hori et al. | ................... | 365/203 |

OTHER PUBLICATIONS

Mazda, Electronics Engineer's Reference Book, 5th Edition, Butterworths, 1983, p. 30/6.*

* cited by examiner

Primary Examiner—Van Thu Nguyen
Assistant Examiner—J. H. Hur
(74) Attorney, Agent, or Firm—Law Office of Charles W. Peterson, Jr.; Louis J. Percello, Esq.; Satheesh K. Karra, Esq.

(57) ABSTRACT

Bit and write decode/drivers, a random access memory (RAM) including the decode/drivers and an IC with a static RAM (SRAM) including the decode/drivers. The decode/drivers are clocked by a local clock and each produce access pulses wider than corresponding clock pulses. The bit decode/driver produces bit select pulses that are wider than a word select pulse and the write decode/driver produces write pulses that are wider than the bit select pulses for stable self timed RAM write accesses.

26 Claims, 5 Drawing Sheets

SELF TIMED BIT AND READ/WRITE PULSE STRETCHERS

BACKGROUND OF THE INVENTION

1. Field of the Invention

The present invention is related to random access memories (RAMs) and more particularly to static RAM (SRAM) access timing.

2. Background Description

Integrated circuits (ICs) are commonly made in the well-known complementary insulated gate field effect transistor (FET) technology known as CMOS. A typical CMOS circuit includes paired complementary devices, i.e., an n-type FET (NFET) paired with a corresponding p-type FET (PFET), usually gated by the same signal. Since the pair of devices have operating characteristics that are, essentially, opposite each other, when one device (e.g., the NFET) is on and conducting (ideally modeled as a closed switch), the other device (the PFET) is off, not conducting (ideally modeled as an open switch) and, vice versa. For example, a CMOS inverter is a series connected PFET and NFET pair that are connected between a power supply voltage ($V_{dd}$) and ground (GND).

A typical static random access memory (SRAM) cell is a pair of cross coupled inverters storing a single data bit. A pair of pass gates (FETs) selectively connect the complementary outputs of the cross coupled inverter to a corresponding complementary pair of bit lines. A word line connected to the gates of the pass gate FETs selects connecting the cell to the corresponding complementary pair of bit lines. Normally, an N row by M column SRAM array is organized as N word lines by M column lines. Each column line includes one or more (K) bit line pairs. Accessing Kbits (for a read or a write) from array entails driving one of the N word lines, turning on the pass gates for all M by K cells on that word line. With the pass gates on for that selected word line, the cross coupled cell inverters are coupled to the corresponding bit line pairs, partially selecting the M by K cells on that word line. Selection of one of the M columns selects the K cells on that word line, the Kbits actually being accessed. The remaining (M−1) by K bits remain partially selected during the access. During a read, each partially selected cell couples its contents to the corresponding bit line pair such that each of the bit line pairs rises/droops, usually, only to develop sufficient signal (e.g., 50 mV) for a sense amplifier. The selected K bit line pairs are coupled to a sense amplifier, which senses the contents of the selected cells from the signal on the coupled K bit line pairs. Then, after sensing data for the selected Kbits, the word line returns low again, deselecting/isolating the M by K cells on that word line.

During a write, however, the K selected bit line pairs are driven to opposite extreme voltages ($V_{dd}$ and GND) or write voltages with the bit line voltages for the remaining partially selected cells being substantially the same as for a read access. With the write voltages on the selected bit line pairs and the word line high, the write voltages on the bit line pairs begin to pass through the selected cell pass gates, i.e. to the cell cross coupled inverters. Any selected cell that is being written with what it already stores, remains unchanged. Any selected cell that is in the opposite state of what is being written must be switched, which takes a minimum time depending upon the cell design and cell technology know as the cell write time. For an ideally balanced cell, it is sufficient to force the cross coupled latches just beyond the voltage mid points (i.e., to $V_{dd}/2+\delta/2$ and $V_{dd}/2-\delta/2$) or beyond cross over before dropping the word line and allowing the cross coupled latches to switch the rest of the way. So, once cell voltages cross over, the word line may be dropped to isolate the M by K cells from the bit line pairs and to capture the new data in the cells. Once the word line is low, the bit line pairs may be released, e.g., both of each pair driven or restored high and decoupled from the write driver.

If insufficient signal develops (i.e., <δ) in the cell, however, the data write may fail and, the cell may remain unswitched or become meta-stable. Either result is unsatisfactory and unreliable because cell contents are indeterminate. So, the write may fail, for example, if the word line drops too soon or, the bit line pair voltage change too soon, e.g., from the write driver terminating prematurely. To avoid this and insure that each write is successful, both the word line must be held high for the minimum write time and, the selected bit line pairs must be held at the write voltages at least until after the word line is returned low.

For a synchronous SRAM design, typically, word selection is a multiple of a timing period, e.g., a half cycle, chosen to meet array timing constraints. So, for a write, while the word line is selected for that multiple, i.e., at least as long as the minimum write time, a second longer timing unit (e.g., 2 timing periods or a full cycle) are required for bit and write control signals to insure that the bit line pair voltages remain stable until after the word line is unselected. This extends the write access time. Unfortunately, once sufficient additional time is added for restoring the bit lines and write driver, access cycles are considerably longer than the word line select, perhaps as much as three or four times as long. This impairs SRAM performance and performance for anything accessing the SRAM.

Thus, there is a need to reduce RAM access time.

SUMMARY OF THE INVENTION

It is a purpose of the invention to improve RAM data reliability;

It is another purpose of the invention to minimize RAM write access time;

It is yet another purpose of the invention to insure data is written reliably to selected cells in a minimized write access time.

The present invention relates to bit and write decode/drivers, a random access memory (RAM) including the decode/drivers and an IC with a static RAM (SRAM) including the decode/drivers. The decode/drivers are clocked by a local clock and each produce access pulses wider than corresponding clock pulses. The bit decode/driver produces bit select pulses that are wider than a word select pulse and the write decode/driver produces write pulses that are wider than the bit select pulses for stable self timed RAM write accesses.

BRIEF DESCRIPTION OF THE DRAWINGS

The foregoing and other objects, aspects and advantages will be better understood from the following detailed description of a preferred embodiment of the invention with reference to the drawings, in which.

DESCRIPTION OF PREFERRED EMBODIMENTS

Figure 1A:
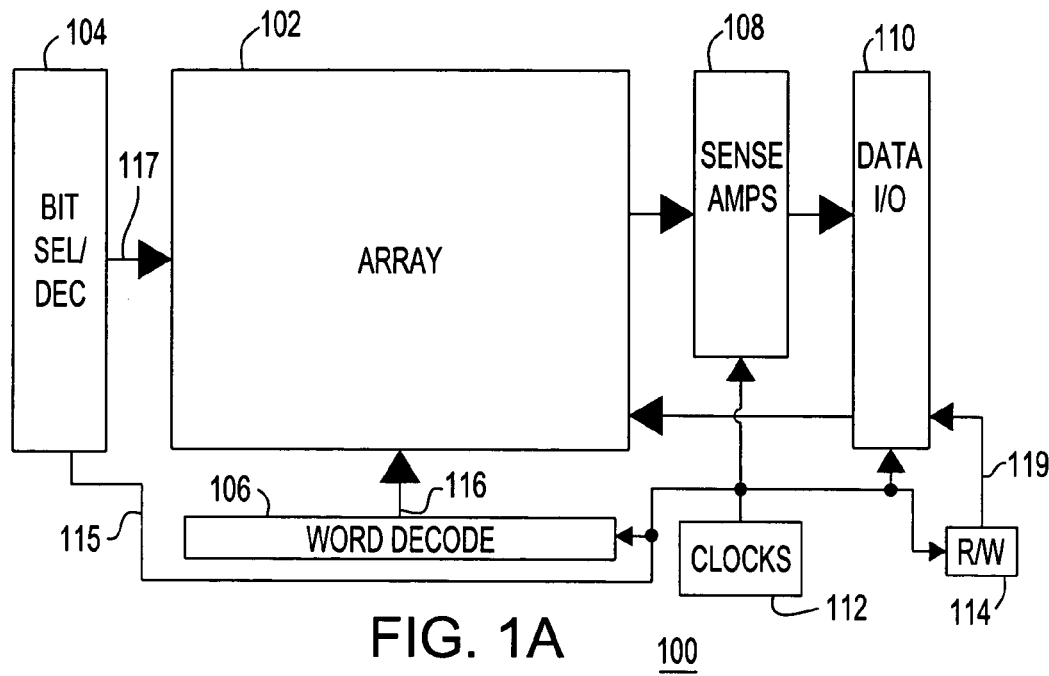
FIG. 1A shows an example of a block diagram of a preferred embodiment memory with a high performance self timed bit decode and write pulse stretcher.
Figure 1B:
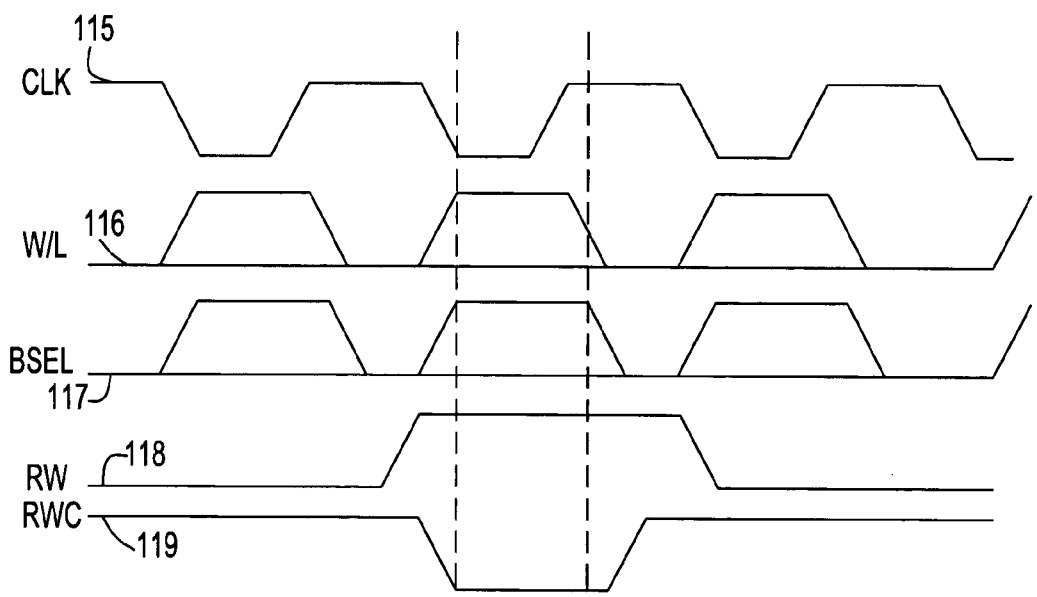
FIG. 1B shows a timing diagram for the memory example of FIG. 1A.

Referring now to the drawings, and more particularly, FIG. 1A shows an example of a block diagram of a memory 100, e.g., a random access memory (RAM) macro or chip, with a high performance self timed bit decode and write pulse stretcher, according to a preferred embodiment of the present invention. FIG. 1B shows a timing diagram for the memory example of FIG. 1A. In this example, the memory array 102 includes cells of well known six transistor (6T) latches or storage cells or 8T 2 port RAM cells (not shown) organized in N rows of word lines by M columns of K bit lines. More particularly, the storage array may be a typical CMOS SRAM or 2 port SRAM in what is known as silicon on insulator (SOI) technology, although application of the present invention is advantageous to almost any technology and any SRAM.

Cell selection is by coincidence a column selected by preferred bit decode and select circuit 104 with a row selected by word decoder 106. Selected cells are coupled to suitable state of the art sense amplifiers 108 for reading data stored in cells during a read. Data from the sense amplifiers 108 are passed to suitable state of the art data input/output (I/O) transceivers 110. Clock logic 112 provides local timing. A write pulse stretcher 114 selectively enables self timed array writes, synchronized by the clock logic 112. Data in for a write selectively passes from I/O transceivers to cells in the array 102 as selected by the bit decode and select circuit 104 and enabled by write pulse stretcher circuit 114. Glue logic (not shown) provides local control logic.

As can be seen from the timing diagram example of FIG. 1B, showing the relationship of various signals to a local clock 115 from clock logic 112 providing local timing synchronization edges. Word decoder 106 provides N word line signals 116. Bit decode and select circuit 104 provides M bit select signals 117. A Read/Write (RW) input 118 to write pulse stretcher 114 initiates a write pulse 119 from the write pulse stretcher 114. It should be noted that the timing edges are not to scale and representative of the positional timing relationships only. With each clock cycle (115), one of the N word lines (116) may be pulsed high, selecting a corresponding one of the N word lines, with the remaining N−1 word lines held low. Also, one of the M bit select signals 117 may be selected in each access, with the remaining M−1 bit select signals held low. The bit select pulses in 117 are longer than the word line pulses in 116, which insures that at the end of each access, the cells on the selected word line are isolated from corresponding bit lines before the bit line states change. Assertion of a WRITE 118 initiates a write select pulse 119, that is longer than the bit select pulse (117) and insures that selected bit lines are disconnected from the bit write driver (e.g., in Data I/O 110) before the write pulse ends. Thus, a preferred embodiment memory provides a self timed write, stretched such tat it is only marginally longer than the word line pulse width.

Figure 2A:
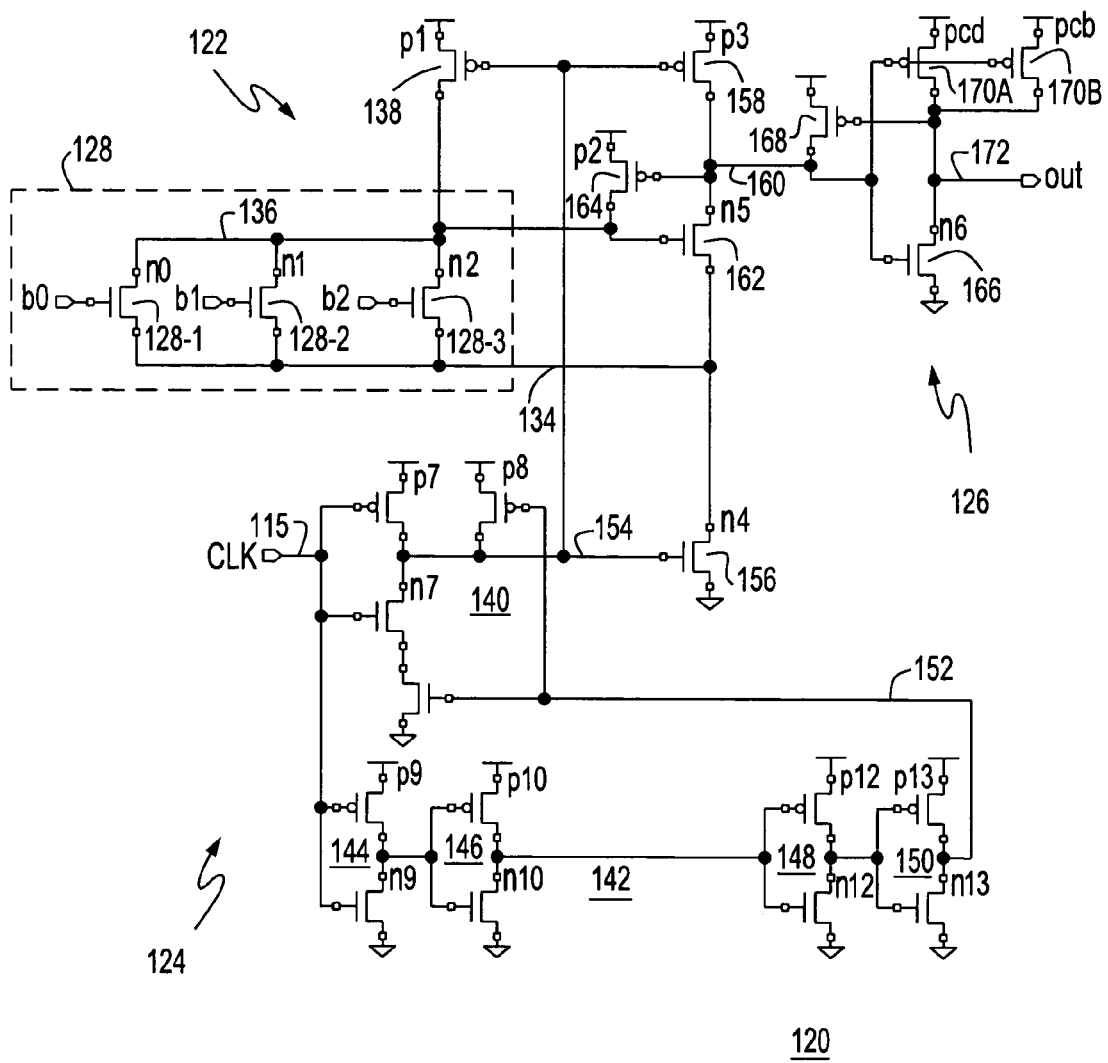
FIG. 2A shows an example of a bit decode pulse stretcher.
Figure 2B:
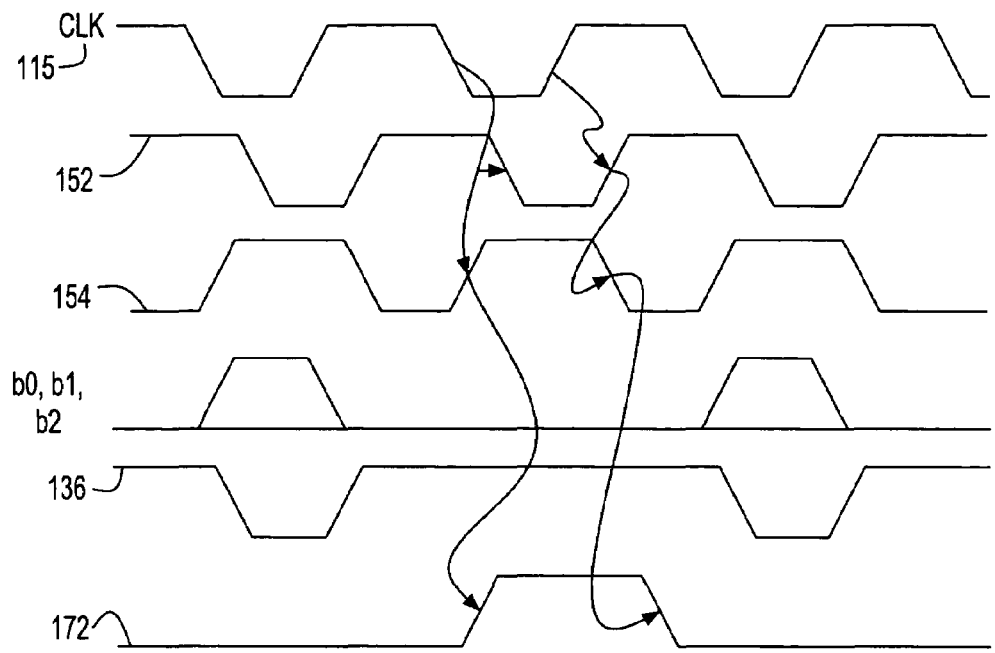
FIG. 2B shows a timing diagram for the bit decode pulse stretcher of FIG. 2A.
Figure 2C:
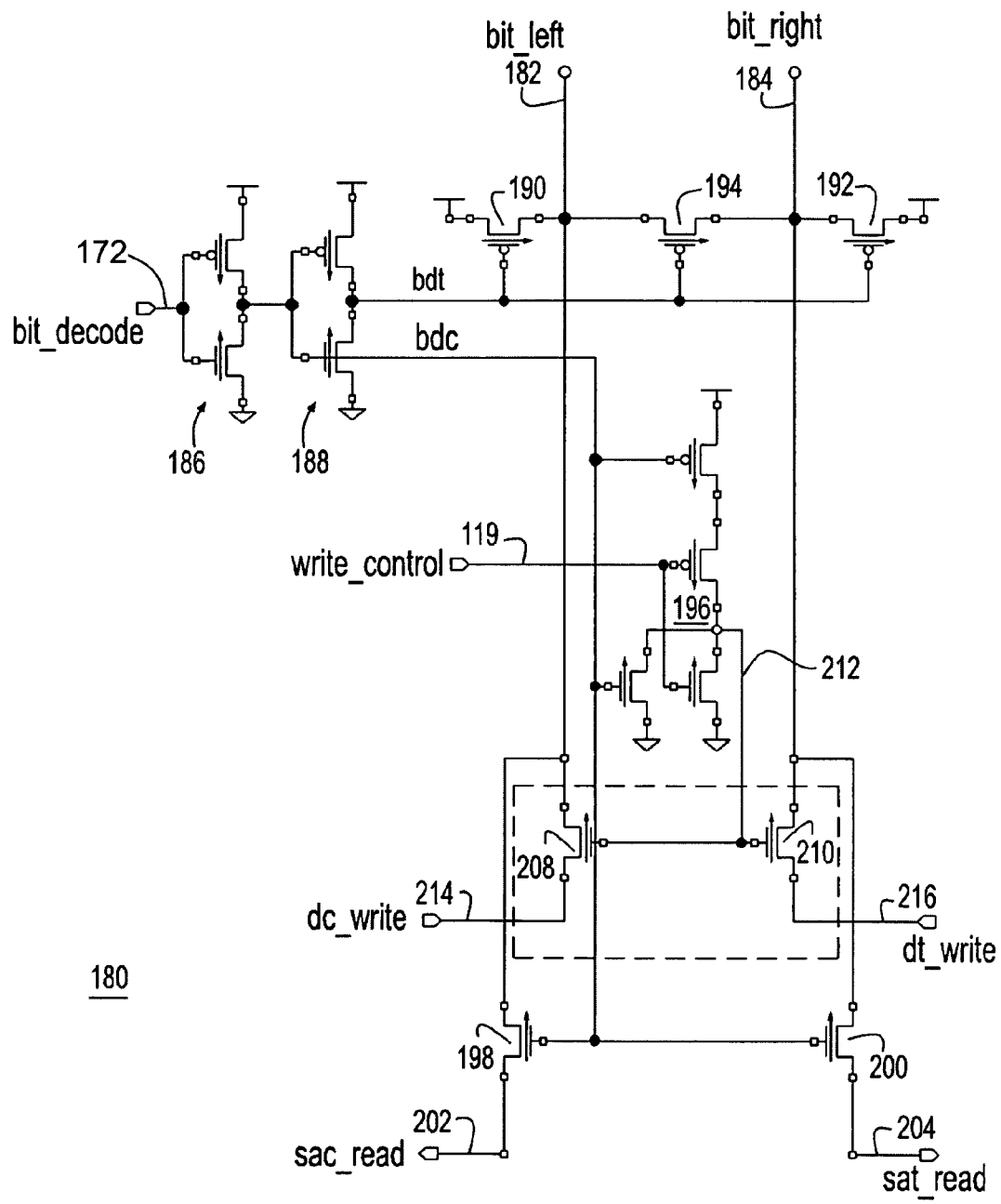
FIG. 2C shows an example of a column select driver for a complementary bit line pair.

FIGS. 2A–C show an example of a cross section of a preferred bit decode and select circuit 104 of FIG. 1 and timing for the cross section. FIG. 2A shows an example of a bit decode pulse stretcher 120 that includes an address decode 122, a pulse stretcher 124 and a driver 126. In this example the address decode 122 includes one of eight decode logic 128, e.g., a dynamic NOR decode receiving a 3 bit partial address (b0, b1, b2) signal at the gates of parallel connected NFETs 128-1, 128-2, 128-3, which are connected between a common source node 134 and a decode node 136. It should be noted that, although the address decode 122 of this example is a one of eight dynamic NOR decode, this is for example only and not intended as a limitation. Any suitable decode logic may be used, including but not limited to, self resetting logic or delayed clock logic.

A decode precharge PFET 138 gated by pulse stretcher 124 precharges decode node 136 high. Pulse stretcher 124 includes a 2 input NAND gate 140 and delay 142. In this example, delay 142 is a group of (4) series connected inverters 144, 146, 148, 150. The clock 115 is the input to delay 142 and one input to the 2 input NAND gate 140. The output 152 of delay 142 is the second input to 2 input NAND gate 140. The output 154 of 2 input NAND gate 140 is the output of pulse stretcher 124 and drives decode precharge PFET 138, decode enable NFET 156 and decode enable precharge PFET 158. Decode enable NFET 156 is connected between common source node 134 and a supply return, e.g., ground. Decode enable PFET 158 is connected between the decode output 160 and a supply voltage ($V_{dd}$). Decode node 136 is connected to the gate of NFET 162 and to the drain of PFET 164. NFET 162 is connected between decode output 160 and common source node 134. The decode output 160 also is connected to the gate of pseudo latch PFET 164, which is connected between $V_{dd}$ and decode node 136 and holds decode node 136 high when it is left floating high, i.e., the particular bit line is not selected. The decode output 160 is the input to driver 126, which includes a driver NFET 166, a pseudo latch PFET 168 and, in this example, a pair of driver PFETs 170A and 170B driving output 172, i.e., a column select. Thus, driver NFET 166 is connected between the output 172 and ground; and, PFETs 170A and 170B are connected between the output 172 and $V_{dd}$. Pseudo latch PFET 168 is connected between $V_{dd}$ and decode output 160 and is gated by output 172, e.g., 118 in FIG. 1B.

As can be seen form the timing diagram of FIG. 2B for one of the eight (in this example) decoders 120, at steady state between accesses with the clock input 115 high, the delay output 152 is high and pulse stretcher output 154 is low. The low on pulse stretcher output 154 holds PFETs 138 and 158 on, clamping decode node 136 and decode output 160 both high. NFET 156 is off, floating common source node 134. With decode output 160 high, driver output 172 is low and pseudo latch PFET 164 is off. With output 172 low, pseudo latch PFET 166 is on, pulling decode output 160 high. A decode occurs on the fall of the clock input 115, when the output of a single selected decoder 120 is driven high.

So, in this example, each of the three address signals, b0, b1 and b2, is a true or complement of one of three address bits. Except for the selected address decoder 122 at least one of these three bit address signals, b0, b1 and b2, rises or is high for all but one address decoder 122, i.e., the address decoder 122 corresponding to the selected column address. So, when the clock input 115 falls, the pulse stretcher output 154 rises, turning off precharge PFET 138 and turning on decode enable NFET 156 which pulls common source node 134 to ground. For the seven (in this example) unselected bit address decoders 122, the decode node 136 is pulled low, holding NFET 162 off. With NFET 162 off, decode output 160 remains high and bit decode output 172 remains low.

For the selected address decoder 122, however, the decode node 136 remains high. So, NFET 162 turns on, pulling decode output 160 low, which turns on pseudo latch PFET 164 to clamp the decode node 136 high. In response to the low on the address decoder output 160, the driver 126 drives bit decode output 172 high, which is the complement of the address decoder output 160. With bit decode output 172 high, pseudo latch PFET 168 turns off. When the clock low period ends and the clock 115 rises, pulse stretcher 154 remains high until the clock edge passes through the delay 142. When the rising edge of the clock exits the delay 142, both inputs to NAND gate 140 are high to drive the pulse stretcher output 154 low. The low on pulse stretcher output 154 turns off decode enable NFET 156 and turns on decode precharge PFET 138 and decode enable precharge PFET 158. Decode precharge PFET 138 pulls the decode node 136 high on the seven unselected decoders 122 with the eighth remaining high. Decode enable precharge PFET 158 pulls the selected decoder output high 160 and, in response, the driver 126 drives output 172 low; the unselected seven outputs remain low. Thus, the pulse out of the selected decoder output 172 is approximately the same width as the pulse stretcher output 154 of NAND gate 140 and, longer than both the word line pulse and the clock low period, stretched by the length of the delay 142.

FIG. 2C shows a column select driver 180 for a complementary bit line pair 182, 184, connected to a number (N) of cells (not shown), each connected to one of N word lines in an array 102. The column select driver 180 includes a pair of series connected inverters 186, 188. The first inverter 186 receives a decoded column select signal 172 from a preferred embodiment bit decode pulse stretcher, e.g. 120. The second inverter 188 drives bit line pull up devices, PFETs 190, 192, and an equalization device, PFET 194. The output of the first inverter 186 is an input to a 2 input NOR gate 196 and drives a pair of bit line select pass gates, PFETs 198, 200, which are read pass gates, passing a complementary signal on the selected bit line pair 182, 184 to a sense amplifier (108 in FIG. 1) during a read on complementary data line pair 202, 204, respectively. A write control signal 119 is a second input to the 2 input NOR gate 196. A pair of write devices, NFETs 208, 210, are driven by the output 212 of 2 input NOR gate 196, selectively coupling complementary input data on data write pair 214, 216 to bit line pair 182, 184, respectively.

In a typical access, an array word line (not shown) is driven high selecting a row of cells and, a selected column signal 172 pulses high at the input to the corresponding first inverter 186 to select one column. The output of the first inverter 186 falls and the output of the second inverter 188 rises. The high turns off bit line pull up devices 190, 192 and equalization device 194, floating the bit line pair 182, 184, allowing a signal to develop. The low on bit line select pass gates 198, 200 couples the bit line pair 182, 184 to the data line pair 202, 204. During a read, the write input 119 to NOR gate 196 remains high. So, the write devices 208, 210 remain off because the output of NOR gate 196 is low. During a write, the write input 119 pulses low. So, the write devices 208, 210 turn on when the output first inverter falls, driving the output of NOR gate 196 high. With the write devices 208, 210 on, data passes from data write pair 214, 216 to the bit line pair 182, 184.

Figure 3B:
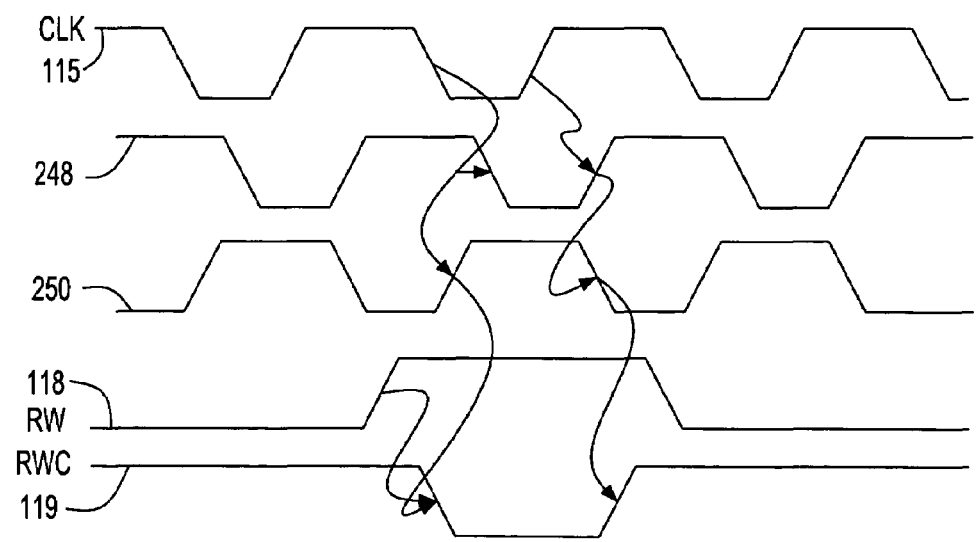
FIGS. 3A–B show an example of a preferred embodiment write pulse stretcher and a corresponding timing diagram.
Figure 3A:
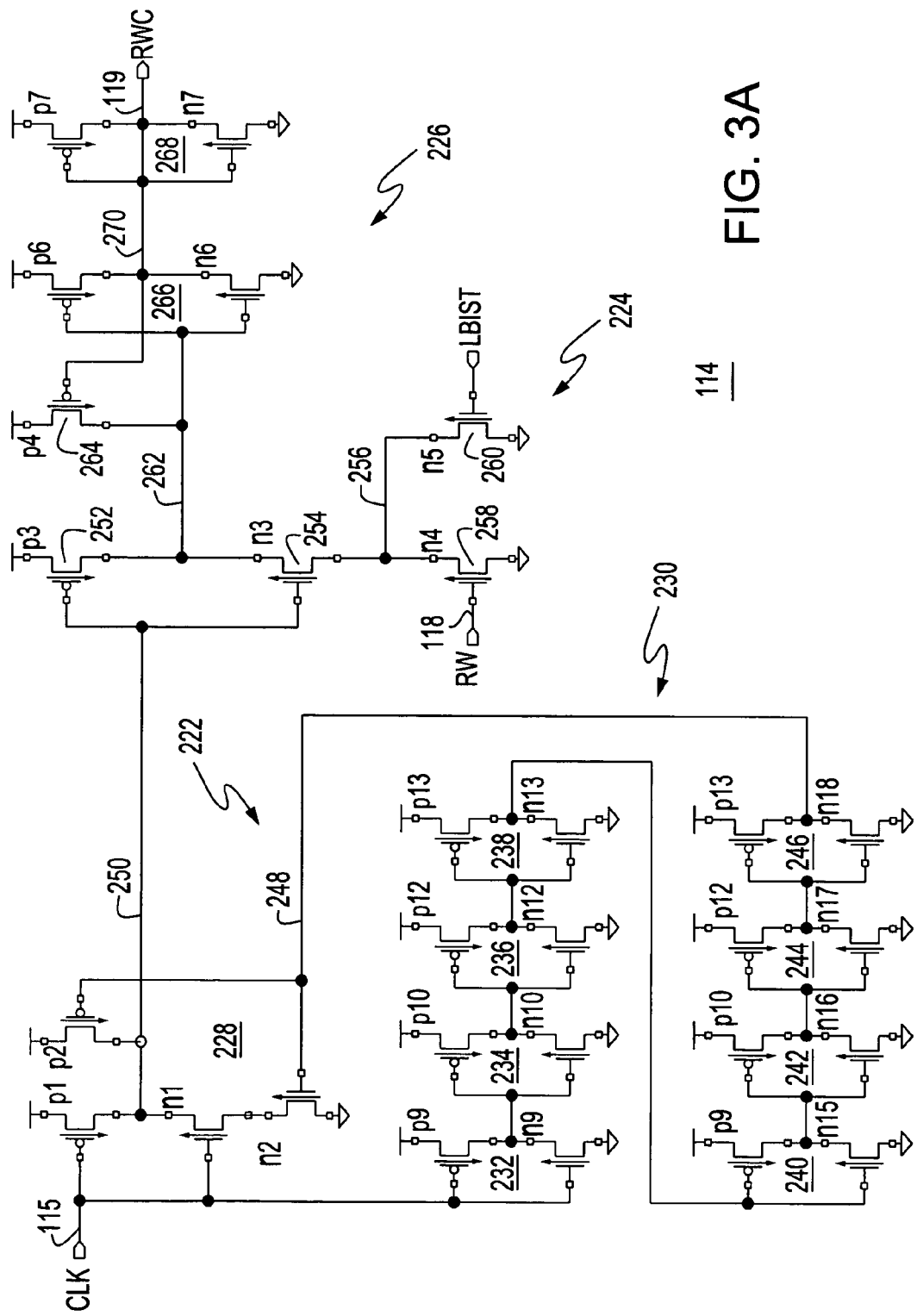

FIG. 3A show an example of a write pulse stretcher 114, which includes a pulse stretcher 222, a READ/WRITE decode 224 and a driver 226 and FIG. 3B is a corresponding timing diagram. As with pulse stretcher 124 of FIG. 2A, this pulse stretcher 222 also includes a 2 input NAND gate 228 and a delay 230. In this example, delay 230 is a group (8) of series connected inverters 232, 234, 236, 238, 240, 242, 244, 246. This delay 230 operates substantially the same as bit decode delay 142 in FIG. 2A except that delay 230 stretches the write pulse by approximately twice the amount as bit decode delay 142. The same clock 115 is an input to the 2 input NAND gate 228 and delay 230. The output 248 of the delay 230 is the second input to NAND gate 228. The output of NAND gate 228 is the output 250 of the pulse stretcher 222 and drives READ/WRITE decode 224. It should be noted that any suitable delay may be selected; provided, that the pulse width is such that the trailing (falling) edge exits before the end of the clock up period and does not encroach on the next following clock, which could result in double pulsing.

Continuing this example, the READ/WRITE decode 224 is a dynamic NOR with a PFET/NFET complementary pair 252, 254 series connected between $V_{dd}$ and a write enable node 256 and a pair of parallel connected NFETs 258, 260 between write enable node 256 and ground. It should be noted that, although both address decode logic 130 in FIG. 2A and READ/WRITE decode 224 are shown herein as NOR gates, any suitable decode logic may be substituted. NFET 258 is gated by a write select signal 118 and NFET 260 is gated by a test write signal, e.g., for loading the array during test. The drains of the complementary pair 252, 254 are the output 262 of the READ/WRITE decode 224 and the input to the driver 226. The driver 226 includes a pseudo latch PFET 264 and a pair of series inverters 266, 268. The pseudo latch PFET 264 is connected between $V_{dd}$ and the READ/WRITE decode output 262 and is gated by the output 270 of the first inverter 266. The output of the second driver inverter 268 is the write pulse stretcher output 119.

At steady state between accesses, when the clock 115 is high, the delay output is high and pulse stretcher output 250 is low. The low on pulse stretcher output 250 holds NFET 254 off and PFET 252 on to pull decode output 262 high. With decode output 262 high, the output 270 of inverter 266 is low, driver output 119 is high and pseudo latch PFET 264 is on. As noted hereinabove, delay 230 operates substantially identically as described for bit decode pulse stretcher 124. So, when the clock 115 is low, pulse stretcher output 250 is high; when the clock 115 rises, pulse stretcher output 250 falls, but only after the clock traverses the delay 230; and, when the clock 115 falls again, the pulse stretcher output 250 rises with no additional delay. With both write select signals low to parallel NFETs 258, 260, READ/WRITE decode output 262 and driver output 119 remain high; inverter 266 holds pseudo latch PFET 264 on, clamping READ/WRITE decode output 262 high. Thus, regardless of the clock state, unless either of the write select signals is high, write pulse stretcher output 119 remains high. However, when either of the write select signals is high, READ/WRITE decode 224 acts as an inverting driver, passing the low clock pulse through the pulse stretcher 222, which stretches the pulse as described above for bit decode 120.

Advantageously, bit decode pulses are wider than word line pulses; and write pulses are longer than bit decode pulse. Therefore, provided the word line select pulse is long enough for a write, data is reliably written with each write and without appreciably extending the write access beyond a read access. Thus, the present invention improves SRAM performance and reliability, providing maximum available read and write times without compromising array cell stability, especially for half selected cells. In particular, the trailing edges of the bit select and write pulses overlap the word select pulse, which may be as little as 40% of the minimum cycle time. Further, the present invention has application to any suitable RAM, e.g., a 2 port RAM, wherein a write takes an appreciably longer time than a read.

While the invention has been described in terms of preferred embodiments, those skilled in the art will recognize that the invention can be practiced with modification within the spirit and scope of the appended claims.

What is claimed is:

1. A CMOS bit decoder comprising:
   a pulse stretcher stretching clock pulses;
   a dynamic bit decode selectively passing stretched said clock pulses responsive to a column address, said dynamic bit decode comprising:
      an n bit address decode connected between a decode node and a common source node,
      a restore FET connected between a supply and said decode node,
      a complementary pair of enable FETs, a first of said complementary pair being connected between said supply and a decode out of said bit decode, a second of said complementary pair being connected between a supply return and said common source node, the gate of said restore FET and of each of said complementary pair being connected to an output of said pulse stretcher,
      a decode out FET connected between said decode out and said common source node, said decode node being connected to the gate of said decode out FET, and
      a first pseudo latch FET connected between said supply and said decode node and gated by said decode out; and
   a column driver receiving passed said stretched clock pulses and driving said column select pulses responsive to received said stretched clock pulses.

2. A CMOS bit decoder as in claim 1, wherein said pulse stretcher comprises:
   a delay receiving a local clock and passing a delayed clock; and
   a NAND gate receiving said local clock and said delayed clock and providing stretched said clock pulses.

3. A CMOS bit decoder as in claim 2, wherein said NAND gate is a 2 input NAND gate and said delay is a group of series connected inverters.

4. A CMOS bit decoder as in claim 1, wherein said write driver comprises:
   a second pseudo latch FET connected between said supply and said decode out; and
   a decode out inverter driving said column select pulses and connected to the gate of said second pseudo latch FET, said decode out being an input to said decode out inverter.

5. A CMOS bit decoder as in claim 4, wherein each of said decode out FET and said second of said complementary pair are N-type FETs and each of said restore FET, said first of said complementary pair, said first pseudo latch FET and said second pseudo latch FET are P-type FETs.

6. A CMOS bit decoder as in claim 5, wherein said n-bit address decode comprises n parallel NFETs connected between said decode node and said common source node and said decode out inverter comprises a pair of parallel FEETs.

7. A CMOS random access memory (RAM) comprising:
   a memory array comprising a plurality of memory cells organized as a plurality of rows and columns;
   a word decoder selecting a word line identifying one of said rows responsive to a memory location access request;
   a bit decoder providing column select pulses responsive to said memory location access request, said bit decoder comprising:
      a pulse stretcher stretching clock pulses,
      a dynamic bit decode selectively passing stretched said clock pulses responsive to a column address, said dynamic decode comprising:
         an n bit address decode connected between a decode node and a common source node,
         a restore FET connected between a supply and said decode node,
         a complementary pair of enable FETs, a first of said complementary pair being connected between said supply and a decode out of said bit decode, a second of said complementary pair being connected between a supply return and said common source node, the gate of said restore FET and of each of said complementary pair being connected to an output of said pulse stretcher,
         a decode out FET connected between said decode out and said common source node, said decode node being connected to the gate of said decode out FET, and
         a first pseudo latch FET connected between said supply and said decode node and gated by said decode out, and
      a column driver receiving passed said stretched clock pulses from said bit decode and driving said column select pulses responsive to received said stretched clock pulses;
   a column select selecting a column responsive to said column select pulses; and
   a write select selectively providing write select pulses, said write select pulses being wider than corresponding said column select pulses.

8. A CMOS RAM as in claim 7, wherein said write select comprises:
   a pulse stretcher stretching clock pulses;
   a READ/WRITE decode selectively passing stretched said clock pulses responsive to a write select signal; and
   a write driver receiving passed said stretched clock pulses and driving said write select pulses responsive to received said stretched clock pulses.

9. A CMOS RAM as in claim 8, wherein said RAM is a CMOS RAM and said READ/WRITE decode is a dynamic decode comprising:
   a pair of series connected complementary field effect transistors (FETs), stretched said clock pulses being connected to the gates of said pair, a common drain connection of said pair being a READ/WRITE decode output; and
   at least one write enable FET, selectively providing a pat to wound for said pair.

10. A CMOS RAM as in claim 9, wherein said write driver comprises:
    a pseudo latch P-type FET (PFET), said READ/WRITE decode output being connected to the drain of said pseudo latch PFET; and
    a first inverter, said READ/WRITE decode output being an input to said first inverter.

11. A CMOS RAM as in claim 10, said write driver further comprising a second inverter driving said write select pulses, an output of said first inverter being an input of said second inverter.

12. A CMOS RAM as in claim 7, wherein said write driver comprises:
  a second pseudo latch FET connected between said supply and said decode out; and
  a decode out inverter driving said column select pulses and connected to the gate of said second pseudo latch FET, said decode out being an input to said decode out inverter.

13. A CMOS RAM as in claim 12, wherein each of said decode out FET and said second of said complementary pair are N-type FETs and each of said restore FET, said first of said complementary pair, said first pseudo latch FET and said second pseudo latch FET are P-type FETs.

14. A CMOS RAM as in claim 13, wherein said n-bit address decode comprises n parallel NFETs connected between said decode node and said common source node and, said decode out inverter comprises a pair of parallel P FETs.

15. A CMOS RAM as in claim 7, wherein each said pulse stretcher comprises:
  a delay receiving a local clock and passing a delayed clock; and
  a NAND gate receiving said local clock and said delayed clock and providing stretched said clock pulses.

16. A CMOS RAM as in claim 15, wherein said delay in said write select is twice as long as said delay in said bit decoder.

17. A CMOS RAM as in claim 16, wherein each said NAND gate is a 2 input NAND gate and each said delay is a group of series connected inverters.

18. A CMOS RAM as in claim 16, wherein said column select pulses are wider than word line pulses provided to said selected word line by said word decoder.

19. A CMOS RAM as in claim 18, wherein said plurality of memory cells are static RAM (SRAM) cells.

20. A CMOS RAM as in claim 19, wherein said SRAM cells are 2 port SRAM cells.

21. A CMOS RAM as in claim 18, wherein said RAM is an SRAM macro on an integrated circuit (IC) chip.

22. A CMOS integrated circuit (IC) chip including a static random access memory (SRAM), said SRAM comprising:
  an array comprising a plurality of SRAM cells organized as a plurality of rows and columns;
  a word decoder selectively providing a word line pulse to a word line selected from one of said rows, said word line pulse being synchronized to a local clock, said word decoder pulsing the selected said word line responsive to an access request;
  a bit decoder comprising:
    a pulse stretcher stretching clock pulses,
    a dynamic bit decode selectively passing stretched said clock pulses responsive to a column address, said dynamic bit decode comprising:
      an n bit address decode connected between a decode node and a common source node,
      a restore FET connected between a supply and said decode node,
      a complementary pair of enable FETs, a first of said complementary pair being connected between said supply and a decode out of said bit decode, a second of said complementary pair being connected between a supply return and said common source node, the gate of said restore FET and of each of said complementary pair being connected to an output of said pulse stretcher,
      a decode out FET connected between said decode out and said common source node, said decode node being connected to the gate of said decode out FET, and
      a first pseudo latch FET connected between said supply and said decode node and gated by said decode out, and
    a column driver receiving passed said stretched clock pulses and driving a column select pulse responsive to each received one of said stretched clock pulses, said column select pulse being wider than a word line select pulse from said word decoder;
  a column select selecting a column responsive to said column select pulse; and
  a write select comprising:
    a pulse stretcher stretching clock pulses,
    a READ/WRITE decode selectively passing stretched said clock pulses responsive to a write select signal, and
    a write driver receiving passed said stretched clock pulses from said READ/WRITE decode and driving a write select pulse responsive to each received one of said stretched clock pulses, each said write select pulse being wider than said column select pulse.

23. A CMOS IC as in claim 22, wherein each said pulse stretcher comprises:
  a delay receiving said local clock and passing a delayed said local clock, said delay in said write select being longer than said delay in said bit decoder; and
  a NAND gate receiving said local clock and providing said stretched clock pulses.

24. A CMOS IC as in claim 23, wherein each said NAND gate is a 2 input NAND gate and each said delay is a group of series connected inverters.

25. A CMOS IC as in claim 24, wherein said delay in said write select is twice as long as said delay in said bit decoder.

26. A CMOS IC as in claim 22, wherein said SRAM cells are 2 port SRAM cells.

* * * * *